(12) United States Patent
Lee et al.

(10) Patent No.: US 8,816,243 B2
(45) Date of Patent: Aug. 26, 2014

(54) LASER BEAM IRRADIATION APPARATUS FOR SUBSTRATE SEALING AND METHOD OF MANUFACTURING ORGANIC LIGHT EMITTING DISPLAY DEVICE USING THE SAME

(75) Inventors: Jung-Min Lee, Yongin (KR); Jin-Hwan Jeon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 270 days.

(21) Appl. No.: 12/979,736

(22) Filed: Dec. 28, 2010

(65) Prior Publication Data

US 2011/0165815 A1    Jul. 7, 2011

(30) Foreign Application Priority Data

Jan. 7, 2010    (KR) .................. 10-2010-0001311

(51) Int. Cl.
*B23K 26/00*    (2014.01)
(52) U.S. Cl.
USPC ............ 219/121.65; 219/121.66; 219/121.76; 219/121.77
(58) Field of Classification Search
USPC ............ 219/121.65, 121.66, 121.73, 121.74, 219/121.75, 121.76, 121.77; 445/25
See application file for complete search history.

(56) References Cited

U.S. PATENT DOCUMENTS

| | | | |
|---|---|---|---|
| 4,467,168 A * | 8/1984 | Morgan et al. | 219/121.67 |
| 4,691,093 A * | 9/1987 | Banas et al. | 219/121.63 |
| 5,352,495 A | 10/1994 | Henderson et al. | |
| 5,479,583 A | 12/1995 | Harris | |
| 6,259,058 B1 * | 7/2001 | Hoekstra | 219/121.75 |
| 6,339,207 B1 * | 1/2002 | Bishop | 219/121.63 |
| 7,312,418 B2 | 12/2007 | Tanabe et al. | |
| 7,371,143 B2 * | 5/2008 | Becken et al. | 445/25 |
| 7,390,704 B2 | 6/2008 | Tanaka | |
| 7,537,504 B2 | 5/2009 | Becken et al. | |

(Continued)

FOREIGN PATENT DOCUMENTS

| | | | | |
|---|---|---|---|---|
| EP | 1870194 A1 * | 12/2007 | ........... | B23K 26/067 |
| JP | 08-022635 A | 1/1996 | | |

(Continued)

OTHER PUBLICATIONS

Korean Registration Determination Certificate issued by KIPO on Nov. 30, 2011, corresponding to KR 10-2010-0001311 and Request for Entry attached herewith.

*Primary Examiner* — John Wasaff
(74) *Attorney, Agent, or Firm* — Robert E. Bushnell, Esq.

(57) ABSTRACT

A laser beam irradiation apparatus irradiates a laser beam onto a sealing unit disposed between a first substrate and a second substrate so as to seal the first substrate and the second substrate. A center portion of the laser beam comprises a first beam profile having a beam intensity which increases toward a beam center portion, and a center of each of a plurality of peripheral portions of the laser beam is included in an area onto which the first beam profile is irradiated. The plurality of peripheral portions are symmetrically distributed around the first beam profile, and comprise a plurality of second beam profiles having the same beam intensities. The first beam profile and the plurality of second beam profiles are symmetrically distributed around a center point of the first beam profile and move in synchronization with one another.

8 Claims, 11 Drawing Sheets

(56) References Cited

U.S. PATENT DOCUMENTS

| | | |
|---|---|---|
| 7,557,991 B2 | 7/2009 | Tanaka et al. |
| 7,651,928 B2 | 1/2010 | Fujino et al. |
| 7,714,251 B2 | 5/2010 | Miyairi |
| 2002/0197778 A1 | 12/2002 | Kasahara et al. |
| 2003/0232468 A1 | 12/2003 | Ohnuma |
| 2006/0082298 A1 | 4/2006 | Becken et al. |
| 2006/0119949 A1 | 6/2006 | Tanaka et al. |
| 2007/0128965 A1 | 6/2007 | Burt et al. |
| 2007/0128967 A1 | 6/2007 | Becken et al. |
| 2009/0086325 A1 | 4/2009 | Liu et al. |
| 2009/0308105 A1 | 12/2009 | Pastel et al. |

FOREIGN PATENT DOCUMENTS

| | | |
|---|---|---|
| JP | 09-061611 A | 3/1997 |
| KR | 10-2007-0085333 A | 8/2007 |
| KR | 10-2007-0088671 A | 8/2007 |
| KR | 10-2007-0088682 A | 8/2007 |

* cited by examiner

LASER BEAM IRRADIATION APPARATUS FOR SUBSTRATE SEALING AND METHOD OF MANUFACTURING ORGANIC LIGHT EMITTING DISPLAY DEVICE USING THE SAME

CLAIM OF PRIORITY

This application makes reference to, incorporates the same herein, and claims all benefits accruing under 35 U.S.C. §119 from an application earlier filed in the Korean Intellectual Property Office on the 7th of Jan. 2010 and there duly assigned Serial No. 10-2010-0001311.

BACKGROUND OF THE INVENTION

1. Field of the Invention

The present invention relates to a laser beam irradiation apparatus for substrate sealing, a method of sealing a substrate, and a method of manufacturing an organic light emitting display device using the laser beam irradiation apparatus.

2. Description of the Related Art

Recently, display devices are being replaced with portable, thin flat panel display devices. Among the flat panel display devices, electroluminescent display devices are self-emissive display devices which have a wide viewing angle and an excellent contrast ratio, and a high response speed, and thus are regarded as next-generation display devices. Also, an organic light emitting display device including an emission layer formed of an organic material has excellent luminosity, driving voltage, and response speed characteristics compared to inorganic light emitting display devices, and may realize multiple colors.

Organic light emitting display devices have a structure in which at least one organic layer including an emission layer is interposed between two electrodes.

When water or oxygen from the outside penetrates through the organic light emitting display device, an electrode material may be oxidized or exfoliation may occur, and this may reduce the lifespan and light emitting efficiency of the organic light emitting device, and light emitting colors may be deteriorated.

Accordingly, when manufacturing an organic light emitting display device, an organic light emitting device is usually sealed so as to isolate the organic light emitting device from the outside and so that water does not penetrate therein. Examples of the sealing process include a method in which an inorganic thin film and an organic polymer such as polyester (PET) are laminated on a second electrode of an organic light emitting display device, and a method in which an absorbent is formed in an encapsulation substrate and nitrogen gas is filled in the encapsulation substrate, and then a boundary of the encapsulation substrate is sealed using a sealant such as epoxy.

However, it is impossible to completely block such elements as water or oxygen penetrating from the outside, which destroy the organic light emitting device which is sealed using the above methods, and thus the methods cannot be applied to organic light emitting display devices which are particularly vulnerable to water, and a process for realizing the methods is also complicated. In order to solve these problems, a method in which frit is used as a sealant to improve adhesive properties between a substrate of the organic light emitting device and an encapsulation substrate has been designed.

By sealing an organic light emitting display device by coating frit on a glass substrate, the substrate of the organic light emitting device and the encapsulation substrate are completely sealed, thereby effectively protecting the organic light emitting display device.

A substrate is sealed using frit by coating the frit on a sealing unit of each of the organic light emitting display devices, and irradiating a laser beam onto a sealing unit of each of the organic light emitting display devices by moving a laser beam irradiation apparatus to irradiate the laser beam onto the sealing unit, thereby hardening the frit and sealing the substrate.

SUMMARY OF THE INVENTION

The present invention provides a laser beam irradiation apparatus having a beam profile which increases a temperature uniformity of a cross-section of a glass frit, and a method of manufacturing an organic light emitting display device using the laser beam irradiation apparatus.

According to an aspect of the present invention, a laser beam irradiation apparatus irradiates a laser beam onto a sealing unit disposed between a first substrate and a second substrate so as to seal the first substrate and the second substrate, wherein a center portion of the laser beam comprises a first beam profile having a beam intensity which increases toward a beam center portion, and a peripheral portion of the laser beam comprises a plurality of second beam profiles, wherein a center of each of the plurality of second beam profiles is included in an area onto which the first beam profile is irradiated, and the plurality of second beam profiles are symmetrically distributed around the first beam profile and have the same beam intensities, wherein the first beam profile and the plurality of second beam profiles are symmetrically distributed around a center point of the first beam profile and move in synchronization with one another.

Center portions of the plurality of second beam profiles may maintain a predetermined distance from a center portion of the first beam profile.

Outer portions of the plurality of second beam profiles may be spaced apart a predetermined distance from one another.

Greatest diameters of the plurality of second beam profiles may be smaller than ½ of a greatest diameter of the first beam profile.

A greatest beam intensity of the second beam profiles may be greater than a greatest beam intensity of the first beam profile.

The greatest beam intensity of the plurality of second beam profiles may be greater than the greatest beam intensity of the first beam profile by 10%.

The first beam profiles may have a Gaussian shape.
The second beam profiles may be pillar-shaped.
The second beam profiles may have a Gaussian shape.
The sealing unit may comprise a frit.

According to another aspect of the present invention, a method of manufacturing an organic light emitting display device comprises: forming an organic light emitting unit on a first substrate or a second substrate; forming a sealing unit between the first substrate and the second substrate so as to surround the organic light emitting unit; aligning the first substrate and the second substrate; focusing a laser beam on the sealing unit; wherein a center portion of the laser beam comprises a first beam profile having a beam intensity that increases toward a beam center portion, and a peripheral portion of the laser beam comprises a plurality of second beam profiles; wherein a center of each of the plurality of second beam profiles is included in an area to which the first beam profile is irradiated, and the plurality of second beam profiles are symmetrically distributed around the first beam profile and have the same beam intensities; wherein the first beam profile and the plurality of second beam profiles are symmetrically distributed around a center point of the first beam profile and move in synchronization with one another; and the method further comprises irradiating the laser beam along a sealing line of the sealing unit.

A center of the first beam profile may be focused on a center line of the sealing line to irradiate the laser beam along the center line of the sealing line.

The plurality of second beam profiles may not be arranged on the center line of the sealing line along which the laser beam travels.

Center portions of the plurality of second beam profiles may maintain a predetermined distance from a center portion of the first beam profile.

The distance (D) may be smaller than $\sqrt{2}/4$ of a width of the sealing unit.

Outer portions of the plurality of second beam profiles may be spaced apart a predetermined distance from one another.

A greatest diameter of the plurality of second beam profiles may be smaller than ½ of a width of the sealing unit.

A greatest diameter of the first beam profile may be the same as or greater than a width of the sealing unit.

The greatest diameter of the first beam profile may be substantially the same as the width of the sealing unit.

A greatest beam intensity of the plurality of second beam profiles may be greater than a greatest beam intensity of the first beam profile.

The greatest beam intensity of the plurality of second beam profiles may be greater than the greatest beam intensity of the first beam profile by 10%.

The first beam profile may have a Gaussian shape.

The plurality of second beam profiles may be pillar-shaped.

The plurality of second beam profiles may have a Gaussian shape.

The sealing unit may comprise a frit.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
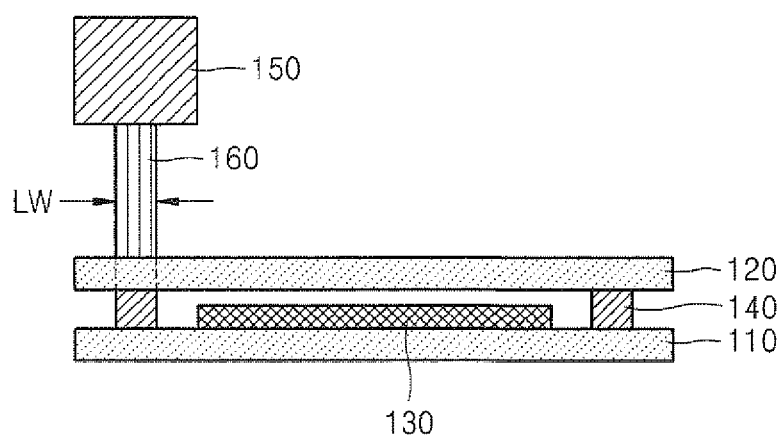
FIG. 1 is a cross-sectional view illustrating a method of sealing a sealing unit of an organic light emitting display device by using a laser beam irradiation apparatus according to an embodiment of the present invention.
Figure 2:
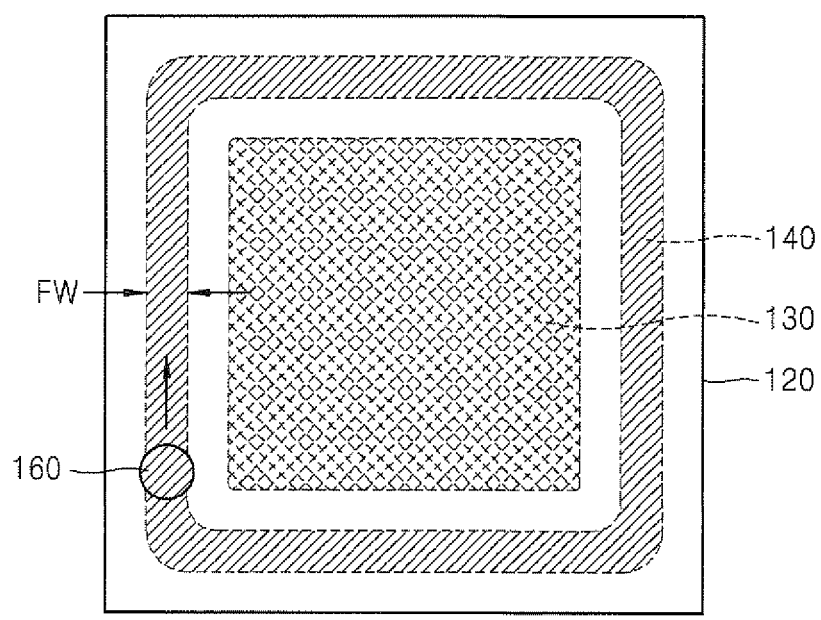
FIG. 2 is a top view of the organic light emitting device of FIG. 1.

FIG. 1 is a cross-sectional view illustrating a method of sealing a sealing unit of an organic light emitting display device by using a laser beam irradiation apparatus according to an embodiment of the present invention, while FIG. 2 is a top view of the organic light emitting device of FIG. 1.

Referring to FIGS. 1 and 2, an organic light emitting unit 130 and a sealing unit 140 which surrounds the organic light emitting unit 130 are disposed between a first substrate 110 and a second substrate 120, and a laser beam 160 irradiated from a laser beam irradiation apparatus 150 is irradiated onto the sealing unit 140.

The organic light emitting unit 130 is formed on the first substrate 110. The first substrate 110 may be a glass substrate.

The second substrate 120 is an encapsulation substrate which encapsulates the organic light emitting unit 130 formed on the first substrate 110, and through which a laser beam to be described later may be transmitted. The second substrate 120 may preferably be a glass substrate.

The organic light emitting unit 130 includes at least one organic light emitting device (OLED) (not shown) in which at least one organic layer (not shown) including an emission layer is interposed between a first electrode (not shown) and a second electrode (not shown). The first electrode (not shown) and the second electrode (not shown) may function as an anode for injecting holes and a cathode for injecting electrons, respectively.

The OLED (not shown) may be classified as a passive matrix (PM) OLED or an active matrix (AM) OLED according to whether the OLED is driven using a thin film transistor (TFT) or not. According to the current embodiment of the present invention, both the PM type and AM type OLED may be used.

The sealing unit 140 is disposed on the second substrate 120 so as to surround the above-described organic light emitting unit 130.

The sealing unit 140 may be a closed loop in order to prevent contact between the organic light emitting unit 130 and water or oxygen from the outside.

Edges of the sealing unit 140 forming the closed loop in FIG. 2 are curved with a predetermined curvature but the current embodiment of the present invention is not limited thereto. That is, the edges of the sealing unit 14 may be right-angled without any curvature.

When each of the edges of the sealing unit 140 has a predetermined curvature, a head (not shown) including an optical system (not shown) of the laser beam irradiation apparatus 150 may be directly and continuously scanned along a sealing line including the edges of the sealing unit 140, thereby irradiating a laser beam 160.

When the edges of the sealing unit 140 are right-angled, the head (not shown) of the laser beam irradiation apparatus 150 may be scanned along a first edge of the sealing unit 140 in a first direction so as to irradiate the laser beam 160, and a stage under the first substrate 110, which is not illustrated in FIG. 1, is also rotated by 90 degrees. When the stage rotates, the first substrate 110 and the second substrate 120 are also rotated with the stage. After rotating the stage, the laser beam 160 is scanned and irradiated in the above-described first direction, and thus the laser beam 160 is irradiated onto a second edge of the sealing unit 140. The sealing unit 140 may be sealed by irradiating the laser beam 160 while rotating the stage (not shown) in the above-described manner.

According to the current embodiment, the sealing unit 140 is formed of a frit so as to provide tightness between the first substrate 110 and the second substrate 120 and so as to effectively protect the organic light emitting unit 130. The frit is formed so as to have a predetermined frit width (FW) by using various methods such as a screen printing method or a pen dispensing method.

Furthermore, according to the current embodiment, the sealing unit 140 is formed on the second substrate 120, and the organic light emitting unit 130 is formed on the first substrate 110 so as to align the first substrate 110 and the second substrate 120, but the present invention is not limited thereto. For example, the sealing unit 140 may be formed on the first substrate 110, on which the organic light emitting unit 130 is formed, and aligned with and adhered to the second substrate 120.

Although one organic light emitting unit 130 is illustrated in FIGS. 1 and 2, a plurality of the organic light emitting units 130 and a plurality of the sealing units 140 which surround the plurality of organic light emitting units 130 may also be disposed between the first substrate 110 and the second substrate 120.

The laser beam irradiation apparatus 150 irradiates the laser beam, in the form of a spot beam having a beam profile according to the current embodiment of the present invention, onto the sealing unit 140 which is disposed between the first substrate 110 and the second substrate 120. This beam irradiation will be described in detail later.

Although not shown in detail in FIGS. 1 and 2, the laser beam irradiation apparatus 150 may include a laser oscillator (not separately shown) which generates a laser, a beam homogenizer (not shown), and a scanner (not shown).

The laser oscillator may be a bundle type multi core source, which is a high output laser source which is typically used for laser sealing.

When using the bundle type multi-core source, the output of each of the cores may vary, and thus the above non-uniform outputs may be solved by using the beam homogenizer (not shown).

The scanner (not separately shown) may include a reflecting unit (not separately shown) which reflects a laser beam which is irradiated from the laser oscillator so as to irradiate the laser beam onto the sealing unit 140, a driving unit (not shown) which drives the reflecting unit, and a lens unit (not separately shown) which collects the reflected laser beam.

The laser beam 160 which is transmitted through the lens unit (not separately shown) is irradiated onto the sealing unit 140 in the form of a spot beam having a beam profile according to an embodiment of the present invention. The lens unit (not shown) may be disposed in the scanner or under the scanner so as to be oriented toward the sealing unit 140.

Although not shown in FIGS. 1 and 2, when a width LW of the laser beam 160 irradiated from the laser irradiation apparatus 150 is greater than a width FW of the sealing unit 140, a laser mask (not separately shown) is disposed between the laser beam irradiation apparatus 150 and the second substrate 120 so as to adjust the width LW of the irradiated laser beam 160 to the width FW of the sealing unit 140.

Figure 3:
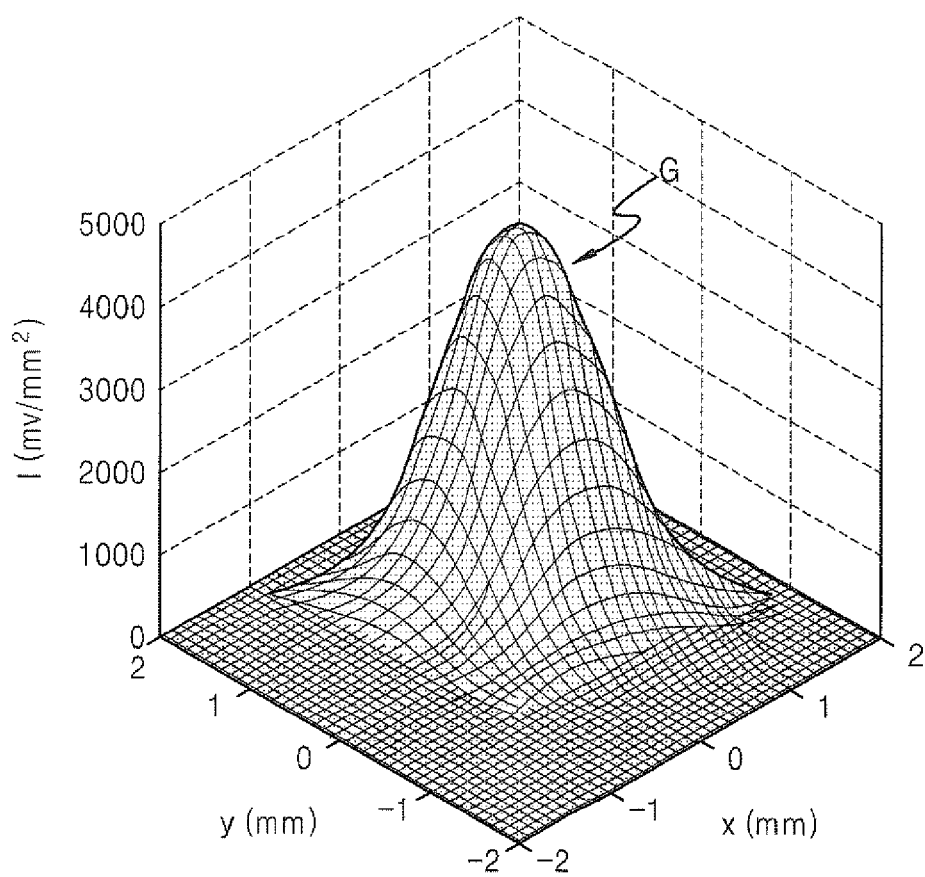
FIG. 3 illustrates a Gaussian beam profile according to a comparative example for comparison with a beam profile which is irradiated from a laser beam irradiation apparatus according to an embodiment of the present invention.
Figure 4:
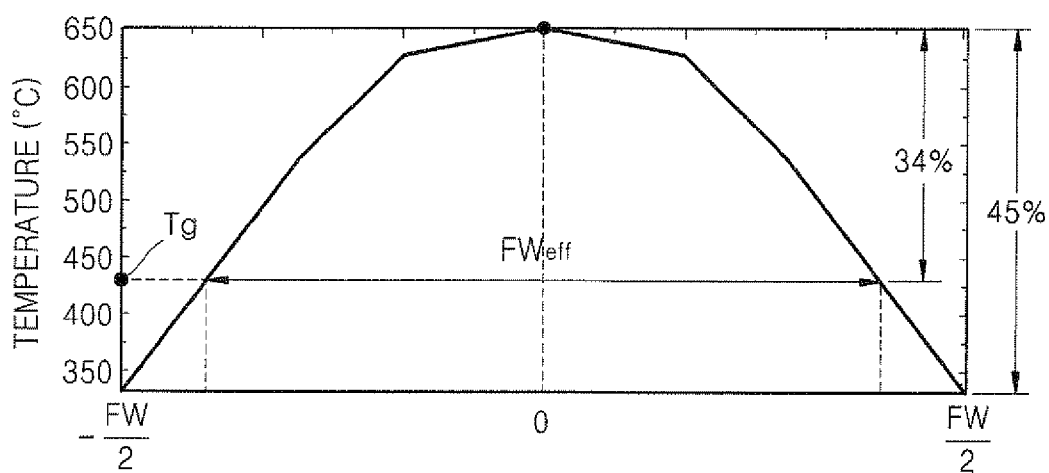
FIG. 4 illustrates a temperature distribution according to a cross-section of a fit when the Gaussian beam profile of FIG. 3 is irradiated to a frit of an organic light emitting display device.

FIG. 3 illustrates a Gaussian beam profile according to a first comparative example for comparison with a beam profile which is irradiated from a laser beam irradiation apparatus according to an embodiment of the present invention, while FIG. 4 illustrates a temperature distribution according to a cross-section of frit when the Gaussian beam profile of FIG. 3 is irradiated onto a frit of an organic light emitting display device.

Referring to FIG. 3, a beam intensity (I) of the Gaussian beam profile G having a Gaussian distribution per unit surface increases toward a center portion of a beam, and the Gaussian beam profile G has an axis-symmetrical distribution.

In the graph of FIG. 3, x and y on the plane refer to horizontal and vertical dimensions, respectively, of a beam profile and, even when a portion of the Gaussian beam profile (G) around a central axis is cut using a laser mask, there is still a difference of about 15% or more between a center portion of the Gaussian beam profile and a peripheral portion thereof which is cut using the laser mask.

When irradiating a laser beam, which has a difference in beam intensity between the center portion and the peripheral portion of the beam profile onto a frit which constitutes the sealing unit 140, there is a temperature difference of 45% or more between a center portion of the frit (at 0 on the horizontal axis) and an end portion of the frit (at ±FW/2 on the horizontal axis) as illustrated in FIG. 4, and there is a temperature difference of 34% maximum between the center portion and the end portion of the frit within an effective sealing width FWeff which corresponds to 80% of a total sealing width FW.

A laser output needs to be increased to maintain the end portion of the frit at a transition temperature (Tg) of the frit, that is, at 430° C. or higher and, in this case, a temperature of the center portion of the frit which is sealed by the center portion of the Gaussian beam profile increases to about 650\° C. or higher, and thus excessive heat is generated, and thus the frit reaches an over-welding state.

Then, small voids which exist on the center portion of the frit to which excessive energy is irradiated expand beyond the end portion of the frit, and the expanded small voids are rapidly cooled again, leaving marks which appear to be boiling bubbles. These bubble marks significantly decrease the adhesive force of the frit of the organic light emitting display device.

Residual stress is determined by a heat expansion rate and a difference in the temperature of the frit between the center portion and the end portion of the frit, the temperatures of which are reduced, and since the center portion of the frit, which is heated to a higher temperature than the end portion of the frit, is cooled later than the end portion of the frit, tensile stress of the center portion of the frit is increased, and thus cracks may be generated in the frit when an impact from the outside occurs.

In order to solve this problem, irradiation of a laser beam having a profile with a uniform beam intensity onto the frit may be considered.

Figure 5:
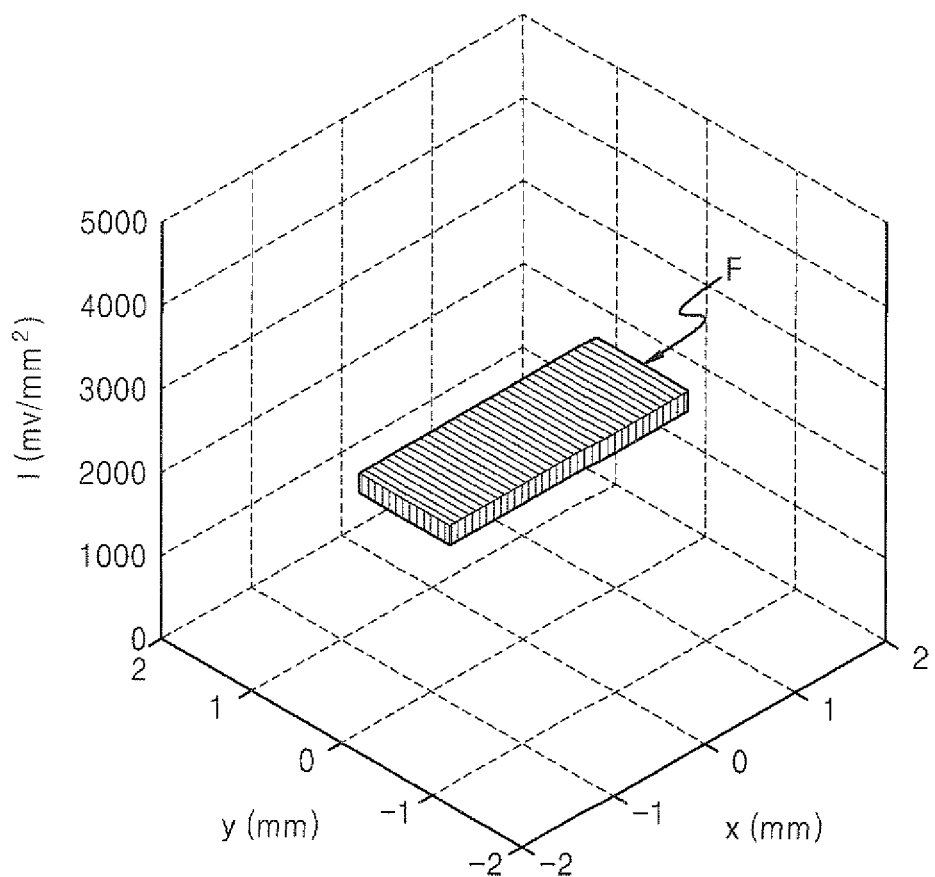
FIG. 5 illustrates a flat top beam profile which is a second comparative example for comparison with a beam profile which is irradiated from a laser beam irradiation apparatus according to an embodiment of the present invention.
Figure 6:
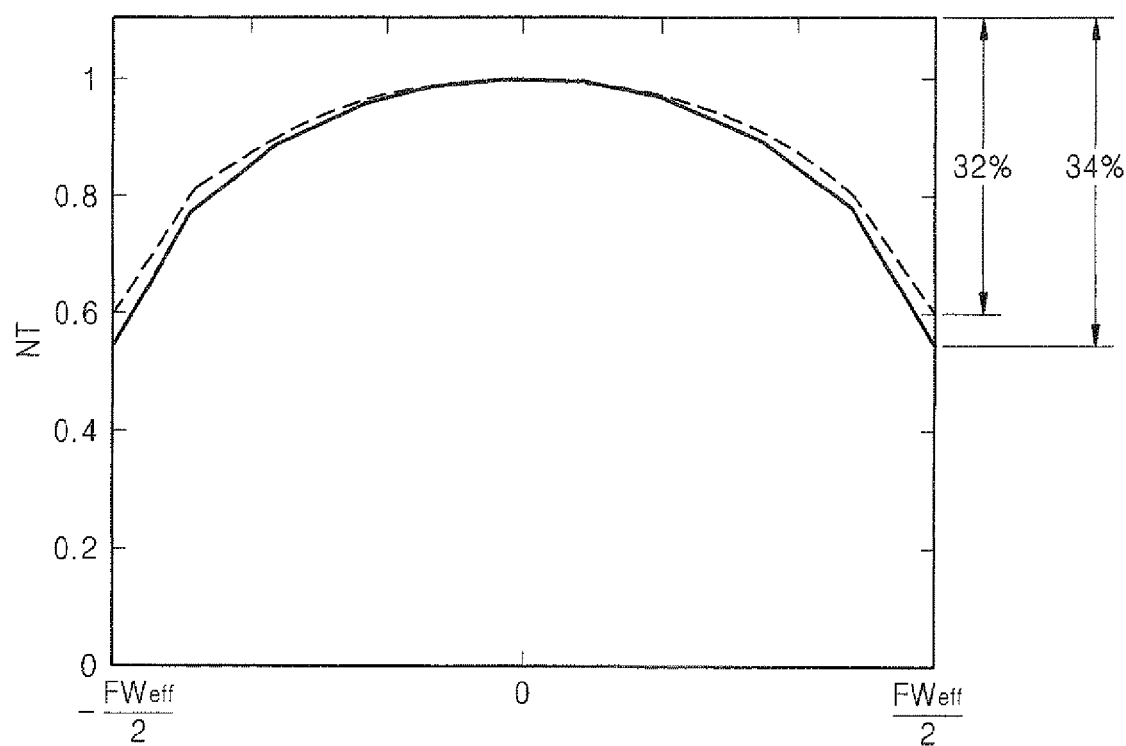
FIG. 6 illustrates normalization of temperature distribution according to a cross-section of a frit within an effective sealing width FWeff when the flat top beam profile of FIG. 5 and the Gaussian beam profile of FIG. 3 are irradiated onto a frit of the organic light emitting display device.

FIG. 5 illustrates a flat top beam profile, which is a second comparative example for comparison with a beam profile which is irradiated from a laser beam irradiation apparatus, according to an embodiment of the present invention, and FIG. 6 illustrates normalization of temperature distribution in a cross-section of frit within an effective sealing width FWeff when the flat top beam profile of FIG. 5 and the Gaussian beam profile of FIG. 3 are irradiated onto a frit of the organic light emitting display device.

Referring to FIG. 5, a laser beam profile F having a flat top distribution has a brick-shaped distribution in which beam intensities (I) of a center portion of a beam and a peripheral portion of the beam per unit surface are uniform.

A horizontal axis of FIG. 6 denotes a position of the frit within the effective sealing width FWeff, and a vertical axis NT denotes normalization of temperature. Referring to FIG. 5 and FIG. 6, even when the flat top laser beam F having a uniform beam intensity is irradiated onto the frit, the temperature uniformity of a cross-section of the frit is reduced from 34% to 32%, that is, by just about 2%, which indicates that the temperature uniformity is barely improved.

This is because heat is more easily dissipated along the end portion of the frit than the center portion of the frit. In order to solve the above problem, the uniform beam intensity of a laser beam irradiated onto the frit is not needed but, rather, the temperature distribution in the cross-section of the frit needs to be adjusted to be uniform after the laser beam has been irradiated. To this end, a larger amount of energy needs to be additionally supplied to the end portion of the frit than to the center portion of the frit.

Hereinafter, referring to FIGS. 7 thru 13, a laser beam profile with which uniformity in temperature distribution on the cross-section of the frit can be improved when sealing a substrate using a laser beam irradiation apparatus, according to embodiments of the present invention, will be described.

Figure 7:
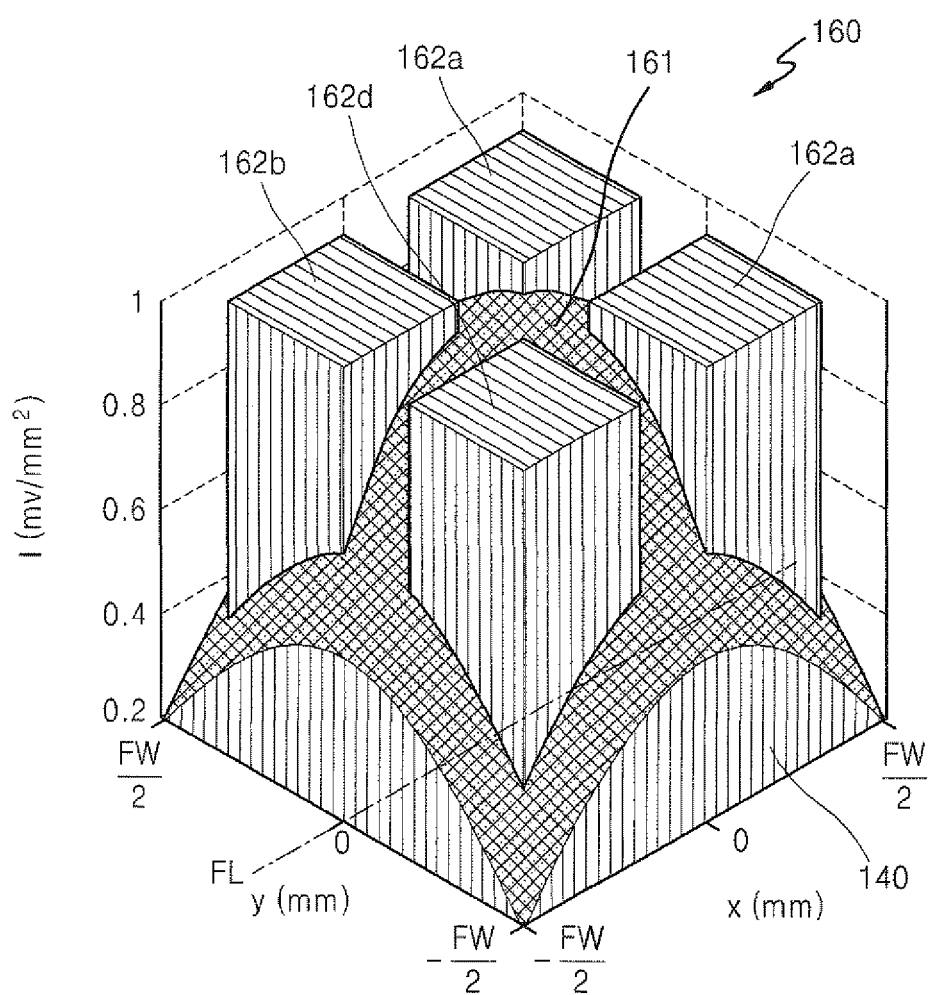
FIG. 7 is a schematic view illustrating a beam profile of a laser beam which is irradiated onto a frit of an organic light emitting display device from a laser beam irradiation apparatus according to an embodiment of the present invention.
Figure 8:
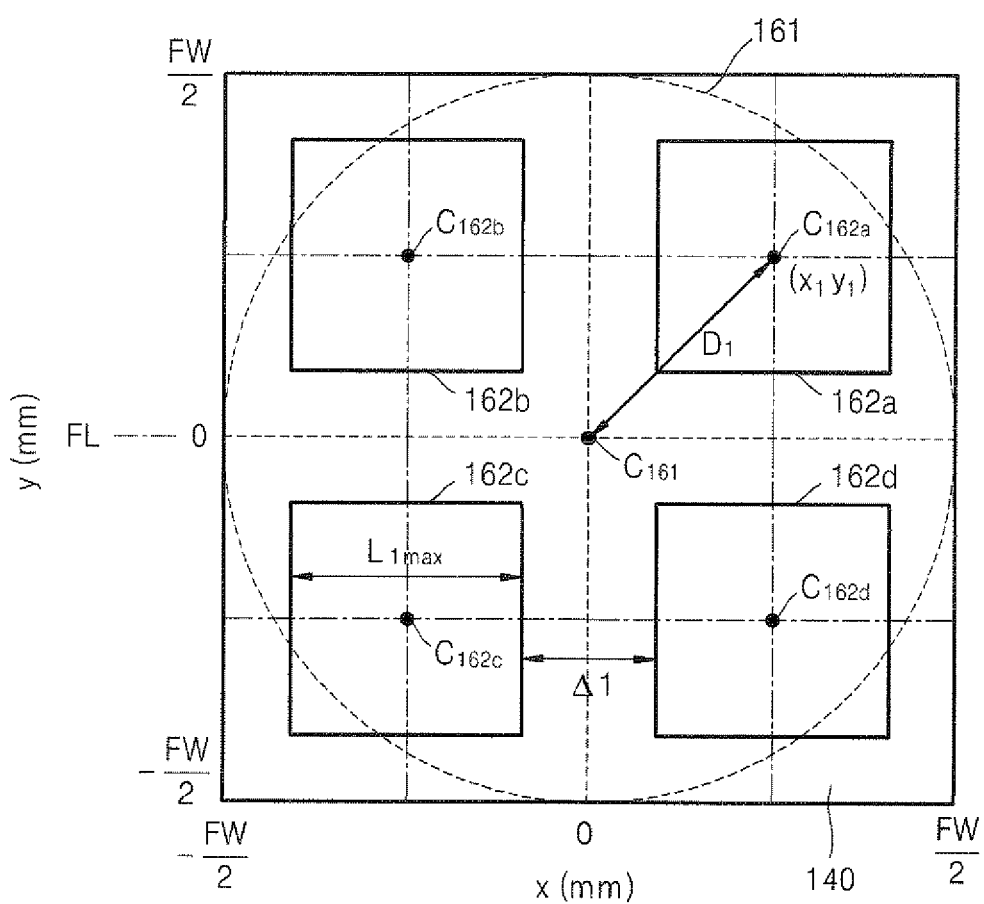
FIG. 8 is a bottom view of the beam profile of FIG. 7.

FIG. 7 is a schematic view illustrating a beam profile of a laser beam which is irradiated onto a frit of an organic light emitting display device in a laser beam irradiation apparatus according to an embodiment of the present invention, while FIG. 8 is a bottom view of the beam profile of the laser beam of FIG. 7.

Orthogonally intersecting horizontal axis x and axis y of FIG. 7 denote a position of a beam profile with respect to a frit width FW, and a height I denotes normalization of intensity of the laser beam.

Referring to FIGS. 7 and 8, a laser beam 160 irradiated from a laser beam irradiation apparatus 150 onto a sealing unit 140 of an organic light emitting display device according to an embodiment of the present invention has a first beam profile 161 having a beam intensity which increases toward a beam center portion, and a plurality of second beam profiles 162a, 162b, 162c, and 162d which are symmetrically distributed around the first beam profile 161.

The first beam profile 161 and the plurality of second beam profiles 162a, 162b, 162c, and 162d are symmetrically distributed around a center C161 of the first beam profile 161, and move in synchronization with one another.

Further referring to FIGS. 7 and 8, the first beam profile 161 is a Gaussian beam profile, the beam intensity of which increases toward a center portion of the beam, but is not limited thereto.

The center portion C161 of the first beam profile 161 is focused onto a center line FL of a sealing line, and is moved along the center line FL of the sealing line.

A greatest diameter of the first beam profile 161 may be a width FW of the sealing unit 140 or greater. In this case, a laser mask (not separately shown) may be disposed between the laser beam irradiation apparatus 150 and the second substrate 120 as described above, thereby adjusting a width LW of the laser beam 160 with the width FW of the sealing unit 140, and preventing the laser beam 160 from irradiating onto wiring around the sealing unit 140 or the organic light emitting unit 130.

The greatest diameter of the first beam profile 161 may be designed to be substantially the same as the width FW of the sealing unit 140. In this case, the laser beam 160 may be directly irradiated onto the sealing unit 140 without using a laser mask (not separately shown).

The plurality of second beam profiles 162a, 162b, 162c, and 162d are symmetrically distributed around the first beam profiles 161. In FIGS. 7 and 8, four of the second beam profiles 162a, 162b, 162c, and 162d are arranged, but the present embodiment is not limited thereto.

Center portions C162a, C162b, C162c, and C162d of the second beam profiles 162a, 162b, 162c, and 162d are distributed within an area onto which the first beam profile 161 is irradiated. In particular, if a position of the center portion C161 of the first beam profile 161 is the starting point (0, 0), x and y coordinates of the center portions C162a, C162b, C162c, and C162d of the second beam profiles 162a, 162b, 162c, and 162d are arranged within a fourth of the width of the sealing unit 140, FW/4. For example, center coordinates x1 and y1 of the second beam profile 162a satisfy $0 < x \leq FW/4$ and $0 < y \leq FW/4$, respectively. According to the current embodiment, the center coordinates of the second beam profile C162a are each FW/4.

The plurality of center portions C162a, C162b, C162c, and C162d of the second beam profiles 162a, 162b, 162c, and 162d maintain a predetermined distance D from the center C161 of the first beam profile 161. In other words, the distance D may be $\sqrt{2}/4$ of the width FW of the sealing unit 140 or smaller.

Furthermore, a greatest diameter L1max of the second beam profiles 162a, 162b, 162c, and 162d is designed to be smaller than the width FW/4 of the sealing unit 140.

As described above, as the center coordinates x and y of the second beam profiles 162a, 162b, 162c, and 162d are not over FW/4 at the greatest, respectively, and the greatest diameter L1max of the second beam profiles 162a, 162b, 162c, and 162d are smaller than FW/4, the laser beam 160 irradiated by the second beam profiles 162a, 162b, 162c, and 162d may be prevented from deviating from the width of the sealing unit 140.

Outer portions of the second beam profiles 162a, 162b, 162c, and 162d are spaced apart by a predetermined distance Δ1 from one another. This is to prevent an increase in temperature behind a sealing area due to an accumulative effect of the beam intensity according to a sealing time while the laser beam 160 is irradiated along the sealing line.

Furthermore, in order to prevent an increase in temperature of a center portion of the sealing unit 140, the second beam profiles 162a, 162b, 162c, and 162d may preferably not be arranged on the center line FL of the sealing line along which the laser beam 160 travels.

According to the current embodiment, the second beam profiles 162a, 162b, 162c, and 162d are pillar-shaped but the present embodiment is not limited thereto. The second beam profiles 162a, 162b, 162c, and 162d may also be in a symmetrical Gaussian distribution.

According to the current embodiment, the pillar-shaped second beam profiles 162a, 162b, 162c, and 162d have square cross-sections, but the present invention is not limited thereto. That is, as long as the second beam profiles 162a, 162b, 162c, and 162d are symmetrically distributed around the center C161 of the first beam profile 161, they may have various cross-sectional shapes such as a circle, a fan-shape, or the like. This will be described in more detail later.

In order to increase temperature uniformity of a frit cross-section, a greatest beam intensity of the second beam profiles 162a, 162b, 162c, and 162d may be greater than a greatest beam intensity of the first beam profile 161. According to the current embodiment, the greatest beam intensity of the second beam profiles 162a, 162b, 162c, and 162d is greater than that of the first beam profile 161 by 10%.

Figure 9:
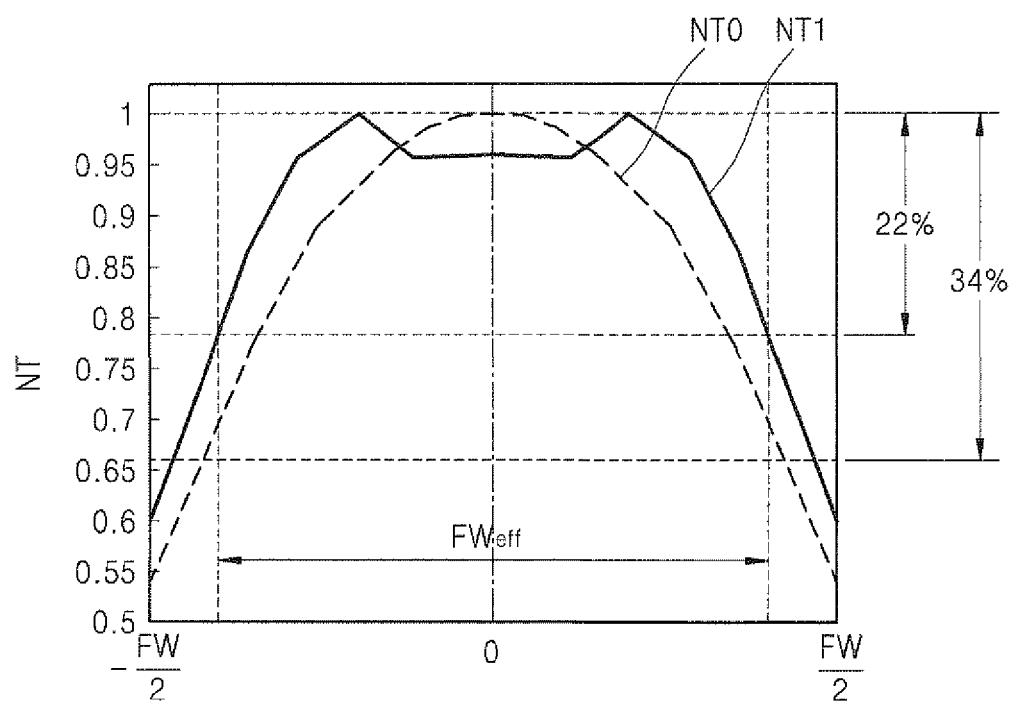
FIG. 9 illustrates normalization of temperature distribution according to a cross-section of a frit when the beam profile of FIG. 7 and the Gaussian beam profile of FIG. 3 are irradiated onto a frit of the organic light emitting display device.

FIG. 9 illustrates normalization of temperature distribution according to a cross-section of a frit when the beam profile 160 of FIG. 7 and the Gaussian beam profile of FIG. 3 are irradiated onto a frit of the organic light emitting display device.

In FIG. 9, a horizontal axis denotes a position of the frit, and a vertical axis (NT) denotes normalization of temperature of a frit cross-section.

In FIG. 9, a graph NT0 of temperature distribution of a frit end portion when irradiating the above-described Gaussian beam profile of FIG. 3, and a graph NT1 of temperature distribution of a frit end portion when irradiating a beam profile according to an embodiment of the present invention, are illustrated.

In the graph NT0, a temperature distribution at the end portion of the frit is 34% within an effective sealing width FWeff but, in the graph NT1, a temperature distribution at the end portion of the frit is 22%, which indicates a rapid decrease in temperature. Accordingly, when irradiating a laser beam having a beam profile according to the current embodiment of the present invention, uniformity of temperature distribution of the end portion of the frit may be increased, thereby increasing the adhesive force of the frit of the organic light-emitting display device.

Furthermore, the laser beam having the beam profile according to the current embodiment of the present invention is axis-symmetrical around a beam center portion, and thus the laser beam may be directly irradiated without rotating a stage but by fixing a laser head to a curved frit edge. Accordingly, misalignment which may be generated between a rotation angle of the laser head and the curved frit edge due to rotation of the laser head is prevented.

Hereinafter, various embodiments of the present invention will be described with reference to FIGS. 10 thru 13.

Figure 10:
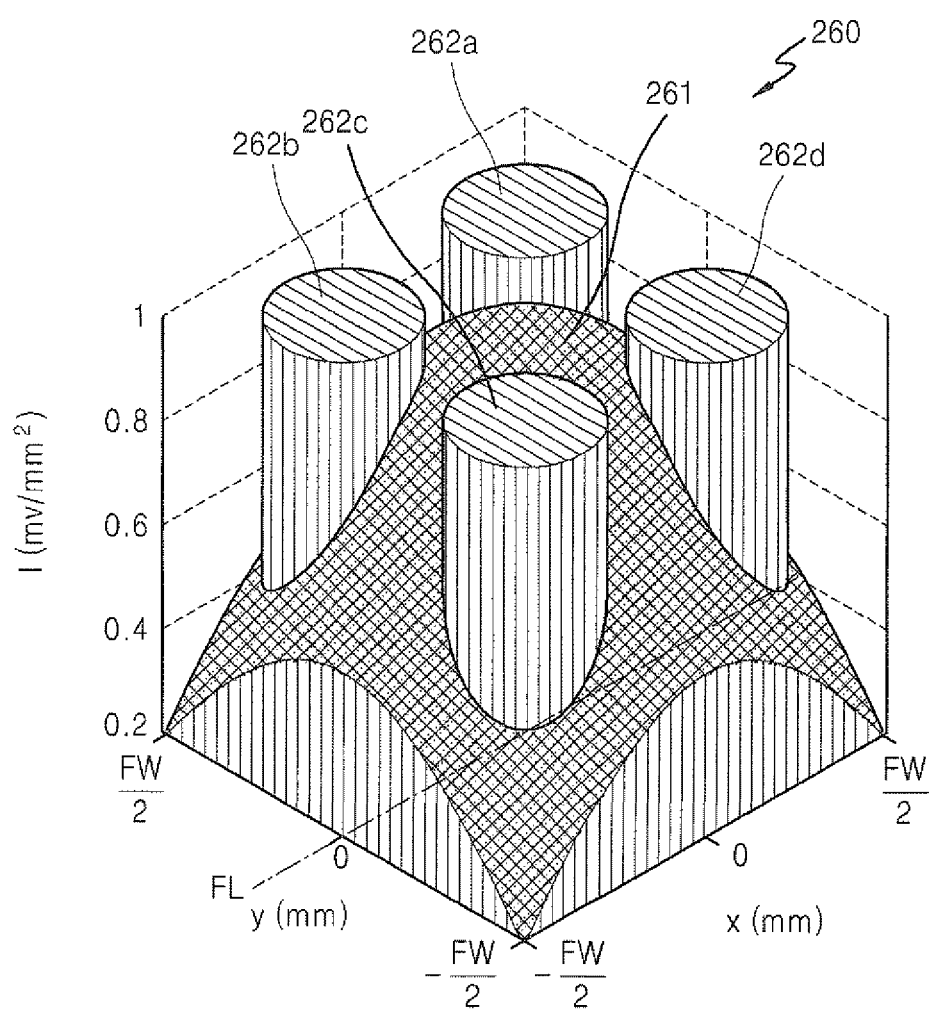
FIG. 10 is a schematic view illustrating a beam profile of a laser beam which is irradiated onto a frit of an organic light emitting display device from a laser beam irradiation apparatus according to an embodiment of the present invention.
Figure 11:
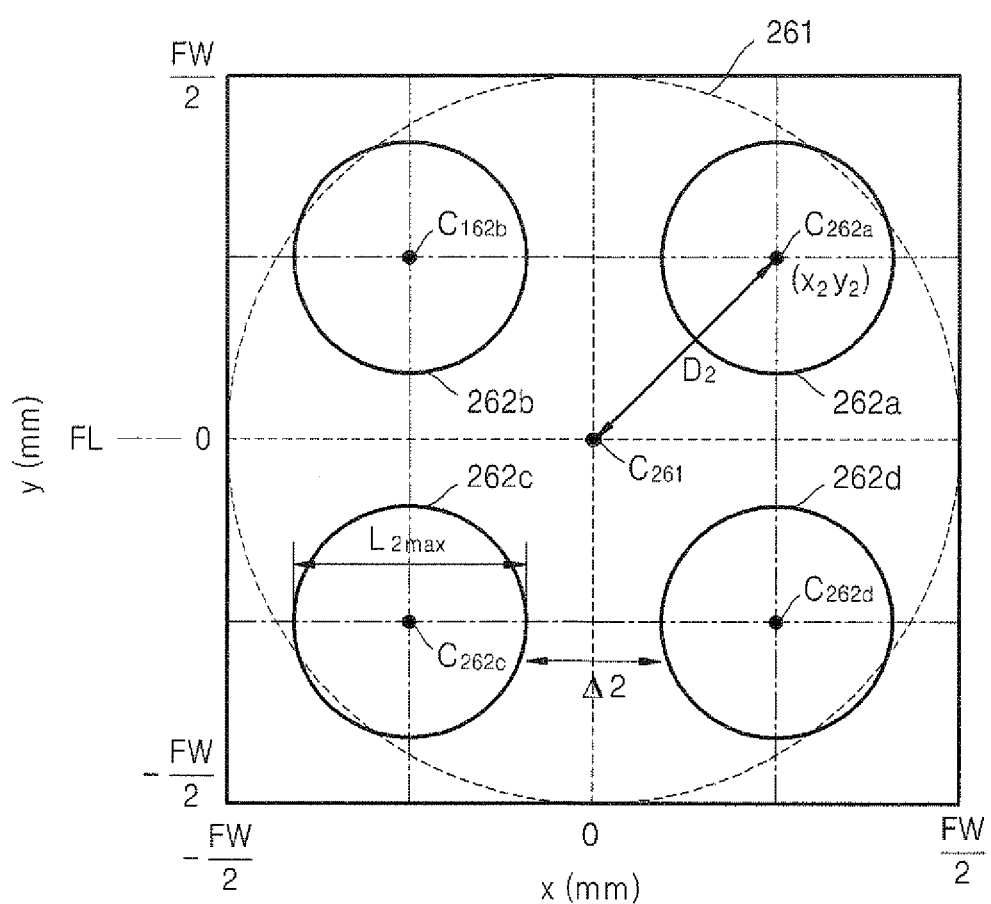
FIG. 11 is a bottom view of the beam profile of FIG. 10.

FIG. 10 is a schematic view illustrating a beam profile of a laser beam which is irradiated onto a frit of an organic light emitting display device from a laser beam irradiation apparatus according to an embodiment of the present invention, and FIG. 11 is a bottom view of the beam profile of FIG. 10.

Like the laser beam 160 of FIG. 7, the laser beam 260 of FIG. 10 has the first beam profile 261 of FIG. 11 having a beam intensity which increases toward a beam center portion and a plurality of second beam profiles 262a, 262b, 262c, and 262d which are symmetrically distributed with respect to one another around the first beam profile 261, and the first beam profile 261 and the second beam profiles 262a, 262b, 262c, and 262d are in a symmetrical distribution with respect to a center C261 of the first beam profile 261, and move in synchronization with one another.

The second beam profiles 262a, 262b, 262c, and 262d of the beam profile 260 have pillar shapes, but the cross-sections thereof are circular, which is different from the beam profile 160 of FIG. 7.

As center coordinates x2 and y2 of the second beam profiles 262a, 262b, 262c, and 262d do not deviate a fourth of the frit width FW/4, and a greatest diameter L2max of the second beam profiles 262a, 262b, 262c, and 262d is designed to be smaller than FW/4, the laser beam 260 irradiated by the second beam profiles 262a, 262b, 262c, and 262d may be prevented from deviating from the frit width FW.

Outer portions of the second beam profiles 262a, 262b, 262c, and 262d are spaced apart by a predetermined distance Δ2 from one another, and thus an increase in temperature behind a sealing area due to an accumulative effect of beam intensity according to sealing time while the laser beam 260 is irradiated may be prevented.

In this regard, in order to prevent increase in the temperature of a center portion of the frit, the second beam profiles 262a, 262b, 262c, and 262d are not arranged on a center line of a sealing line along which the laser beam 260 travels.

Furthermore, in order to increase temperature uniformity of a frit cross-section, a greatest beam intensity of the second beam profiles 262a, 262b, 262c, and 262d is designed to be greater than a greatest beam intensity of the first beam profile 261 by 10%.

Figure 12:
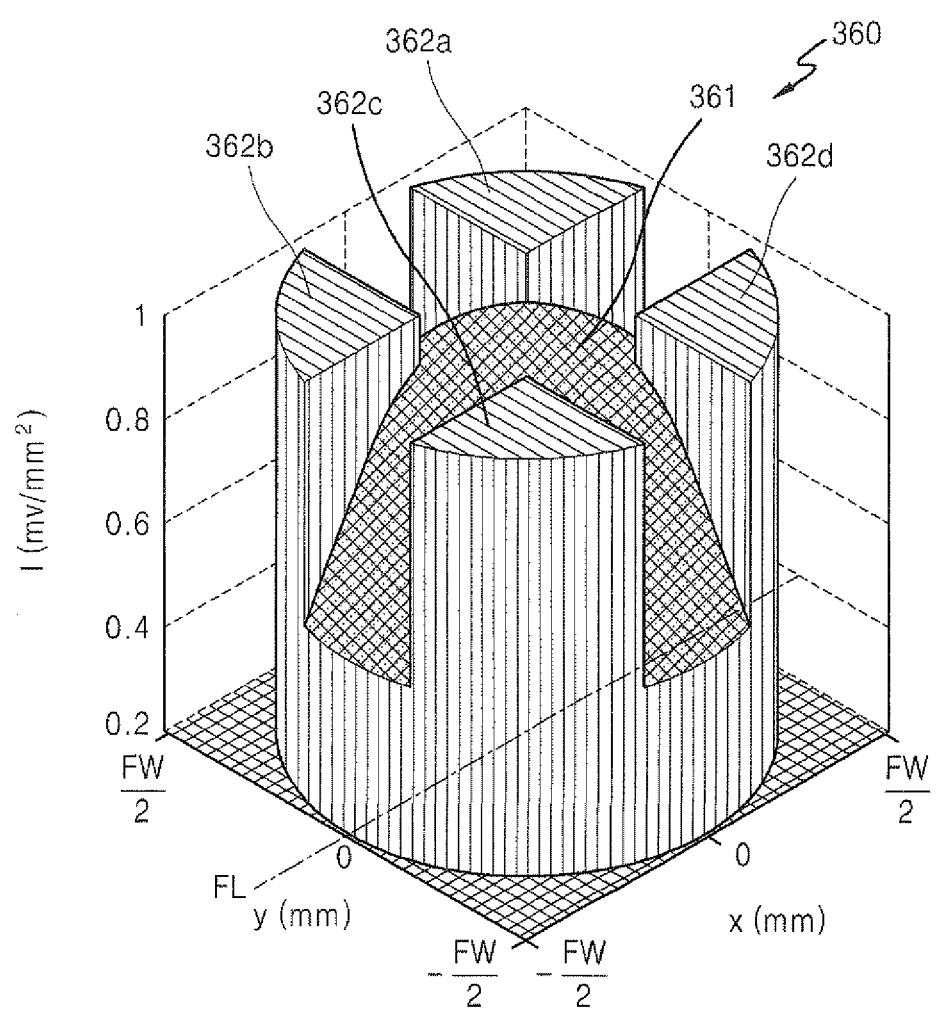
FIG. 12 is a schematic view illustrating a beam profile of a laser beam which is irradiated onto a frit of an organic light emitting display device from a laser beam irradiation apparatus according to an embodiment of the present invention.
Figure 13:
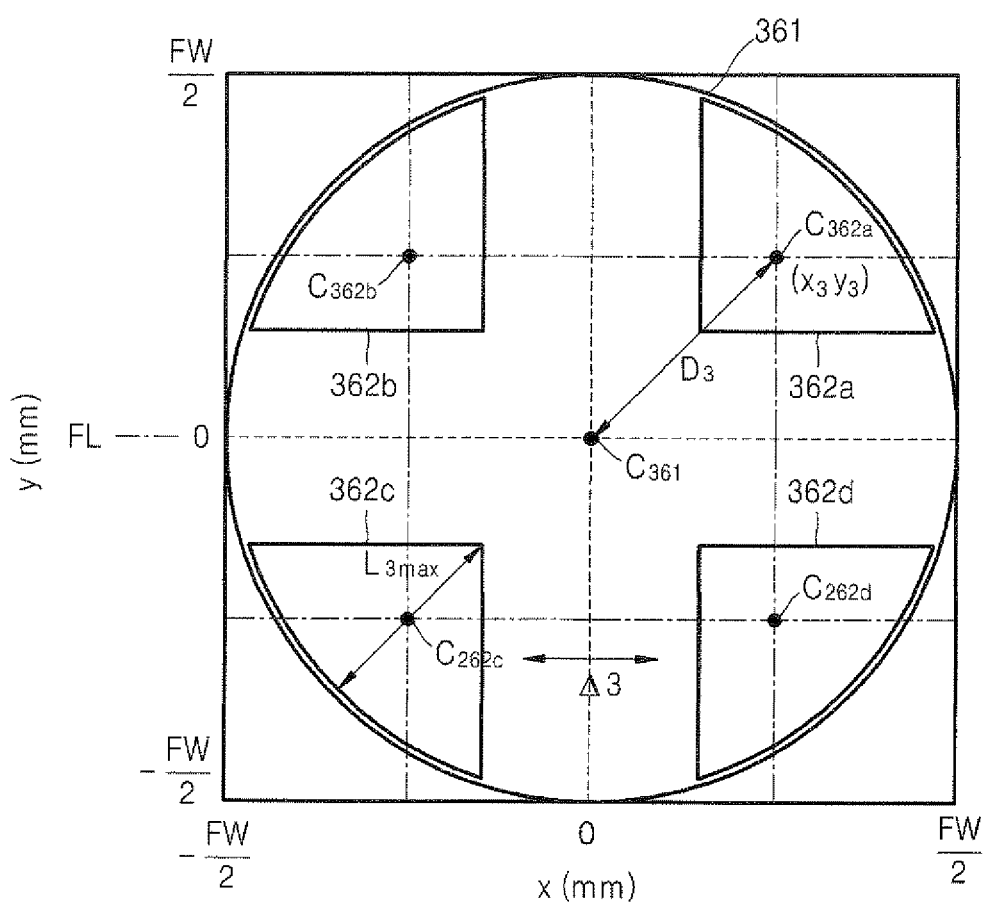
FIG. 13 is a bottom view of the beam profile of FIG. 12.

FIG. 12 is a schematic view illustrating a beam profile of a laser beam which is irradiated onto a frit of an organic light emitting display device from a laser beam irradiation apparatus according to an embodiment of the present invention, and FIG. 13 is a bottom view of the beam profile 360 of FIG. 12.

Like the laser beam 160 of FIG. 7 or the laser beam 260 of FIG. 10, the laser beam 360 of FIG. 12 has a first beam profile 361 having a beam intensity which increases toward a beam center portion and a plurality of second beam profiles 362a, 362b, 362c, and 362d which are symmetrically distributed to one another around the first beam profile 361, and the first beam profile 361 and the second beam profiles 362a, 362b, 362c, and 362d are in a symmetrical distribution with respect to a center C361 of the first beam profile 361, and move in synchronization with one another.

The second beam profiles 362a, 362b, 362c, and 362d of the beam profile 360 have pillar shapes, but cross-sections thereof are fan-shaped.

As center coordinates x3 and y3 of the second beam profiles do not deviate a fourth of the frit width FW/4, and a greatest diameter L3max of the second beam profiles 362a, 362b, 362c, and 362d is designed to be smaller than FW/4, the laser beam irradiated by the second beam profiles 362a, 362b, 362c, and 362d may be prevented from deviating from the frit width FW.

Outer portions of the second beam profiles 362a, 362b, 362c, and 362d are spaced apart by a predetermined distance Δ3 from one another, and thus an increase in temperature behind a sealing area due to an accumulative effect of beam intensity according to sealing time while the laser beam 360 is irradiated may be prevented.

In order to prevent an increase in the temperature of a center portion of the frit, the second beam profiles 362a, 362b, 362c, and 362d are not arranged on a center line of a sealing line along which the laser beam 360 travels.

Furthermore, in order to increase temperature uniformity of a frit cross-section, a greatest beam intensity of the second beam profiles 362a, 362b, 362c, and 362d is designed to be greater than a greatest beam intensity of the first beam profile 361 by 10%.

By irradiating a laser beam, having a beam profile according to the embodiments of the present invention, onto a frit of an organic light emitting display device, uniformity of temperature distribution of an end portion of the frit may be improved, thereby increasing adhesive force of the sealing unit of the organic light emitting display device.

When using the laser beam irradiation apparatus which irradiates a laser beam having a beam profile according to the embodiments of the present invention, misalignment which may be generated between a rotational angle of a laser head and a curved frit edge due to rotation of the laser head may be prevented.

The sealing unit 140 according to the embodiments of the present invention is formed using a frit, but is not limited thereto. The sealing unit 140 may also be formed using other various materials, which are known to one of ordinary skill in the art.

The method of sealing an organic light emitting display device using a laser beam irradiation apparatus has been described with reference to the embodiments of the present invention, but is not limited thereto. That is, as long as a sealing pattern, such as a frit, is included between two substrates, and the substrates are sealed by irradiating a laser beam onto the sealing pattern, the method may be used in various devices, regardless of the type of display devices.

By irradiating a laser beam having a beam profile according to an embodiment of the present invention onto the frit of an organic light emitting display device, uniformity in the temperature distribution of an end portion of the frit may be improved, thereby increasing adhesive force of the sealing unit of the organic light emitting display device.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of manufacturing an organic light emitting display device, the method comprising the steps of:
   forming an organic light emitting unit on one of a first substrate and a second substrate;
   forming a sealing unit between the first substrate and the second substrate so as to surround the organic light emitting unit;
   aligning the first substrate and the second substrate;
   focusing a laser beam on the sealing unit, wherein a center portion of the laser beam comprises a first beam profile having a beam intensity which increases toward a beam center portion, and a peripheral portion of the laser beam comprises a plurality of second beam profiles, wherein a center of each of the plurality of second beam profiles is included in an area onto which the first beam profile is irradiated, and the plurality of second beam profiles are symmetrically distributed around the first beam profile and have the same beam intensities, wherein the first beam profile and the plurality of second beam profiles are symmetrically distributed around a center point of the first beam profile and move in synchronization with one another; and
   irradiating the laser beam along a sealing line of the sealing unit.

2. The method of claim 1, further comprising the step of maintaining center portions of the plurality of second beam profiles a predetermined distance from a center portion of the first beam profile.

3. The method of claim 1, further comprising the step of maintaining outer portions of the plurality of second beam profiles are spaced apart by a predetermined distance from one another.

4. The method of claim 1, further comprising the step of providing the first beam profile with a greatest diameter which is substantially the same as the width of the sealing unit.

5. The method of claim 1, further comprising the step of providing the first beam profile with a Gaussian shape.

6. The method of claim 1, further comprising the step of providing the plurality of second beam profiles are pillar-shape.

7. The method of claim 1, further comprising the step of providing the plurality of second beam profile with a Gaussian shape.

8. The method of claim 1, further comprising the step of providing the sealing unit in the form of a frit.

* * * * *